(12) United States Patent
Tomohiro et al.

(10) Patent No.: US 6,403,012 B1
(45) Date of Patent: Jun. 11, 2002

(54) METHOD OF POLARIZATION-TREATING PIEZOELECTRIC MATERIAL

(75) Inventors: Hiroshi Tomohiro, Shiga-ken; Naoki Fujii, Omihachiman, both of (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 09/455,514

(22) Filed: Dec. 7, 1999

(30) Foreign Application Priority Data

Dec. 16, 1998 (JP) .............................. 10-357028

(51) Int. Cl.7 .............................. G01B 15/00; H05B 6/00
(52) U.S. Cl. .................... 264/406; 264/435; 264/436
(58) Field of Search ................... 264/406, 430, 264/435, 436

(56) References Cited

U.S. PATENT DOCUMENTS 5,543,106 A * 8/1996 Nakashima ............ 264/430
5,605,659 A * 2/1997 Moynihan et al. ....... 264/430
6,129,886 A * 10/2000 Tachimoto et al. ...... 264/614

FOREIGN PATENT DOCUMENTS

JP 07-172914 7/1995

* cited by examiner

Primary Examiner—Christopher A. Fiorilla
(74) Attorney, Agent, or Firm—Burns, Doane, Swecker & Mathis, LLP

(57) ABSTRACT

In a method of polarization-treating a piezoelectric material, the maximum polarization degree $\Delta f_{180max}$ achieved by 180° rotation is determined. A residual polarization degree $\Delta f$ as a target value and the maximum polarization degree $\Delta f_{180max}$ are compared. In the case of $\Delta f \leq \Delta f_{180max}$, a determination is made as to the temperature $T_A$ for obtaining the polarization degree $\Delta f$ made up solely of the polarization degree achieved by 180° rotation. Half-polarization is carried out at the temperature $T_A$, and aging is conducted at the temperature $T_A$, whereby a piezoelectric material of which the ratio of the polarization achieved by 180° rotation is 100%, which is stable thermally with passage of time, and has a polarization degree $\Delta f$ correctly coincident with a target value, can be obtained.

8 Claims, 4 Drawing Sheets

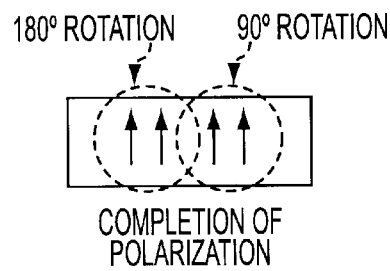
FIG. 1A DIRECTION OF SPONTANEOUS POLARIZATION BEFORE POLARIZATION TREATMENT
FIG. 1B COMPLETION OF POLARIZATION
FIG. 1C 90° RESTORATION CAUSED BY DEGRADATION
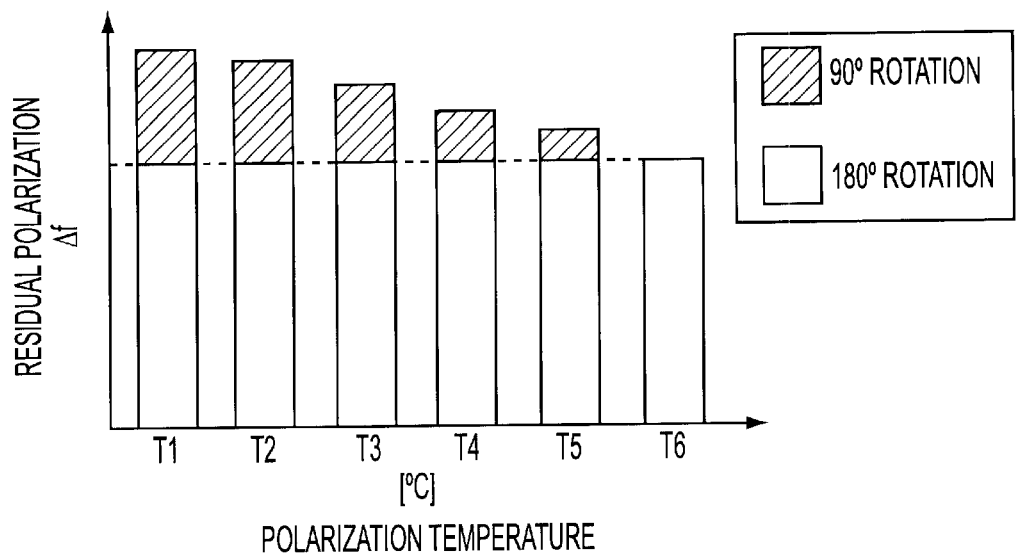
FIG. 2

METHOD OF POLARIZATION-TREATING PIEZOELECTRIC MATERIAL

BACKGROUND OF THE INVENTION

1. Field of the Invention

The present invention relates to a method of polarization-treating a piezoelectric material for use in ceramic filters, ceramic oscillators, and so forth.

2. Description of the Related Art

According to conventional methods of polarizing piezoelectric ceramics having a granular structure, typically in PZT type ceramics, desired polarization degrees are obtained by sputtering a silver electrode onto a firing material, and applying a direct voltage of about 2 to 5 kV/mm at a temperature ranging from room temperature to about 150° C. for a time of from several seconds to several minutes. However, the conventional methods have the drawback that the characteristics of the piezoelectric ceramics are degraded by a thermal shock (by soldering and so forth) generated in a process after the polarization treatment. One of the reasons is speculated to be as follows.

Polarization treatment means that spontaneous polarization is arranged in a predetermined direction. This movement of the spontaneous polarization is achieved by two types of rotation, i.e., 180° and 90° rotation, on the whole. The residual component of the spontaneous polarization achieved by 90° rotation has the property that it is restored to its original state by heating, while the residual component of the spontaneous polarization by 180° rotation has the property that the polarization state is maintained below the Curie temperature. That is, the spontaneous polarization achieved by 180° rotation is more stable to thermal shock as compared with the spontaneous polarization achieved by 90° rotation.

FIGS. 1A, 1B, and 1C illustrate the change in directions of spontaneous polarization. FIG. 1A shows the directions of the spontaneous polarization before polarization treatment, which are different from each other. By the polarization treatment, all the spontaneous polarization is arranged in the same direction as shown in FIG. 1B. After this, by suffering a thermal shock, only the spontaneous polarization achieved by 90° rotation is restored to the original state as shown in FIG. 1C.

A polarization treatment method has been proposed in which the spontaneous polarization of a piezoelectric material achieved by 90° rotation is removed by aging treatment, utilizing the above-described properties, whereby the polarization degree is made up solely of the polarization degree achieved by 180° rotation. (Japanese Unexamined Patent Publication No. 7-172914). As an aging treatment method for this case, a method (first method) of heat-aging at a temperature of from 200 to 250° C., a method (second method) of repeating changing a temperature from −40° C. to 130° C., and then from 130° C. to −40° C. at about 50 cycles, a method (third method) of applying a compression stress of 50 MPa at about 100 cycles, and so forth are exemplified.

However, according to the conventional second and third aging treatment methods, since an excess load is applied to the piezoelectric material, there are problems that cause inconveniences such as cracking, breaking, or the like and the yield is reduced. On the other hand, according to the first aging treatment method, it is difficult to produce a piezoelectric material having a target polarization degree simply by carrying out heat-aging at a temperature of from 200 to 250° C., though the yield is high. In particular, conventionally, the polarization-treatment is carried out at a voltage, time, and a temperature selected appropriately, and thereafter, the aging is conducted until the polarization achieved by 90° rotation is completely removed. Therefore, obtained final polarization degrees are uneven, depending on how much the spontaneous polarization achieved by 180° rotation is present on completion of the polarization treatment.

SUMMARY OF THE INVENTION

Accordingly, it is an object of the present invention to provide a method of polarization-treating a piezoelectric material whereby a target polarization can be attained at a high precision, and the treated piezoelectric material is stable thermally with passage of time.

The inventors carried out polarization and aging under different conditions. As a result, they have found that the ratio of the polarization degree $\Delta f_{180}$ achieved by 180° rotation to the polarization degree $\Delta f_{90}$ achieved by 90° rotation in the polarization degree $\Delta f$ is dominated by the temperature only, irrespective of the polarization voltage and the polarization time. Therefore, when the temperature is predetermined, the ratio of the polarization degree $\Delta f_{180}$ achieved by 180° rotation to the polarization degree $\Delta f_{90}$ achieved by 90° rotation can be principally known.

Throughout this specification, the term "polarization degree" refers to "residual polarization degree" which is a polarization degree at an ordinary temperature after the polarization treatment is completed.

The polarization degree of a piezoelectric material can be expressed by use of a frequency difference $\Delta f$ between the resonance frequency $f_r$ and the anti-resonance frequency $f_a$ of the piezoelectric material, as is well known.

FIG. 2 shows the relation between the polarization temperatures and the polarization degrees achieved by 180° and 90° rotation in the polarization degrees $\Delta f$, which were experimentally determined by the inventors of this invention. The above-mentioned polarization degrees $\Delta f$ are obtained by carrying out the polarization (hereinafter, referred to as total-polarization) by which the maximum polarization degree can be achieved at each polarization temperature. In the experiment, as a piezoelectric material, PZT ceramics were used comprising Pb(ZrTi)O$_3$ to which Sr, Cr were added.

For example, in the case such as in FIG. 2, the polarization temperatures T1 through T6 are 26° C., 50° C., 100° C., 150° C., 200° C., and 250° C., and the aging is carried out at the same temperatures as the polarization temperatures, respectively. The polarization degrees $\Delta f_{180}$ achieved by 180° rotation, after the aging, are constant, irrespective of the temperatures, while the polarization degrees $\Delta f_{90}$ achieved by 90° rotation are reduced with the temperatures being higher, and at the temperature T6, the residual polarization degree $\Delta f$ is made up solely of the polarization degree achieved by 180° rotation. With the polarization temperatures being changed from T1 to T6, the ratios of the polarization degrees achieved by 180° rotation to those by 90° rotation are changed from 77:23 to 78:22 to 81:19 to 85:15 to 90:10 to 100:0, for example. The ratios of the polarization degrees achieved by 180° rotation to the polarization degree achieved by 90° rotation depend on the temperatures only, and are not affected by the polarization voltages and the polarization times (total or half polarization). The polarization treatment may be carried out in the atmosphere or an insulating oil. Thus, the relation as shown in FIG. 3 is obtained. Herein, the term "half polarization" means the polarization before it reaches the total polarization, which is carried out while time and voltage are controlled.

To determine the ratios of the polarization degrees achieved by 180° rotation to the polarization degrees achieved by 90° rotation in the polarization degrees Δf, the (002) lattice plane of a piezoelectric material is measured by XRD (X-Ray Diffraction Method), and then determination is made as to the polarization temperature at which the polarization degree Δf made up solely of the polarization degree achieved by 180° rotation can be obtained.

FIG. 4 shows the relation between the polarization temperatures and the X-ray intensities at the (002) crystal lattice plane. The X-ray intensities are obtained by the measurement of the piezoelectric material wherein the temperature has been restored to a room temperature after the polarization treatment. The term "the (002) lattice plane" means the lattice plane wherein the C axis is in parallel to the polarization direction. As seen in FIG. 4, the X-ray intensities at the (002) lattice plane are reduced with the polarization temperatures being raised. This shows that the polarization achieved by 90° rotation is significantly restored. Further, at the temperature T6, the X-ray intensity at the (002) lattice plane is equal to that before the polarization is carried out. This shows that the polarization achieved by 90° rotation has been completely restored. That is, the temperature T6 is the polarization temperature at which the polarization degree Δf made up solely of the polarization degree achieved by 180° rotation can be obtained. Then, the ratios of the polarization degrees achieved by 180° rotation to those achieved by 90° rotation are determined as follows. First, polarization is carried out at plural appropriate temperatures which are lower than the temperature T6. Then, aging is conducted at the temperature T6. In this case, Δf, which is equal to a decrement caused by the aging at the temperature T6, is the polarization degree achieved by 90° rotation. The remaining Δf is the polarization degree achieved by 180° rotation. As a result the ratios of the polarization degrees achieved by 180° rotation to those by 90° rotation in the polarization degrees Δf as shown in FIG. 3. are obtained.

Based on the above-described knowledge, the inventors have devised methods of polarization-treating a piezoelectric material. According to the present invention, obtained is the maximum polarization degree $\Delta f_{180max}$ achieved by 180° rotation which is determined by an employed piezoelectric material or the like. A target residual polarization degree Δf and the maximum polarization degree $\Delta f_{180max}$ are compared. Methods of polarization-treating a piezoelectric material according to first and second aspects of the present invention are applied in the case of $\Delta f \leq \Delta f_{180max}$ shown as a result of the comparison. That is, these polarization methods are applied in the case that the polarization degree Δf made up solely of the polarization degree achieved by 180° rotation can be obtained.

Herein, the expression "the polarization degree Δf made up solely of the polarization degree achieved by 180° rotation" is defined to include the polarization degree Δf which contains a polarization degree achieved by 90° rotation to some degree, if any.

According to the first aspect of the present invention, first, a determination is made as to the temperature $T_A$ for obtaining the polarization degree Δf made up solely of the polarization degree achieved by 180° rotation. The temperature $T_A$ can previously be determined experimentally. In general, the ratio of the polarization degree achieved by 180° rotation becomes higher with the polarization temperature being increased. Next, the piezoelectric material is half-polarized at the temperature $T_A$ under the control of voltage and time so that the polarization degree $\Delta f_{180}$ achieved by 180° rotation becomes equal to the target polarization degree Δf. At the time when the half-polarization has been completed, the polarization degree includes the polarization degree achieved by 90° rotation, in addition to the polarization degree achieved by 180° rotation. The polarization achieved by 90° rotation, produced by the half-polarization treatment, is completely restored to the original state by aging at the same temperature $T_A$ as that for the half-polarization treatment. As a result, the polarization degree made up solely of the polarization degree by 180° rotation can be obtained. According to this method, a piezoelectric material which is stable thermally with passage of time can be obtained, since the residual polarization degree is made up solely of the polarization degree achieved by 180° rotation with the polarization degree achieved by 90° rotation being completely removed. Moreover, since the polarization degree $\Delta f_{180}$ achieved by 180° rotation is determined at the stage of the half-polarization, a piezoelectric material of which the polarization degree Δf ($=\Delta f_{180}$) is correctly coincident with a target value can be obtained.

According to the second aspect of the present invention, similarly to the method according to the first aspect of the present invention, a determination is made as to the temperature $T_A$ for obtaining the polarization degree Δf made up solely of the polarization degree achieved by 180° rotation. In the case that the target value Δf is achieved with difficulty at the temperature $T_A$, half-polarization is carried out at a temperature $T_P$, at which the polarization control can be easily performed, lower than the temperature $T_A$ under the control of voltage and time so that the polarization degree $\Delta f_{180}$ achieved by 180° rotation is equal to the target polarization degree Δf. On completion of the half-polarization, the polarization degree $\Delta f_{90}$ achieved by 90° rotation is included in the polarization degree Δf. After this, all the polarization achieved by 90° rotation is restored to its original state by aging at the temperature $T_A$. The polarization degree $\Delta f_{180}$ achieved by 180° rotation suffers no changes by the aging. By the above-described operations, similarly to the method according to the first aspect of the present invention, a piezoelectric material of which the residual polarization degree made up solely of the polarization degree achieved by 180° rotation, and which is stable thermally with passage of time can be obtained.

According to third and fourth aspects of the present invention, a determination is made as to the maximum polarization degree $\Delta f_{180max}$ made up solely of the polarization degree achieved by 180° rotation, which is determined by an employed piezoelectric material. A residual polarization degree Δf, which is a target value, and the maximum polarization degree $\Delta f_{180max}$ are compared. Methods according to the third and fourth aspects of the present invention are applied in the case of $\Delta f > \Delta f_{180max}$ shown as a result of the comparison. That is, in the case that the polarization degree Δf made up solely of the polarization degree achieved by 180° rotation is achieved with difficulty by any treatment, these polarization methods are applied to obtain a polarization degree in which the ratio of the polarization degree achieved by 180° rotation is highest. Herein, the above expression, "the polarization degree in which the ratio of the polarization degree achieved by 180° rotation is highest" is defined to include the polarization degree in which the ratio of the polarization degree achieved by 180° rotation is lower to some degree than the highest ratio of the polarization degree achieved by 180° rotation.

According to the third aspect of the present invention, the temperature $T_A$ for obtaining the polarization degree $\Delta f$ of which the ratio of the polarization degree achieved by 180° rotation is highest is determined. Next, total polarization is carried out at the temperature $T_A$, and aging is conducted at the same temperature $T_A$ as that for the polarization treatment, whereby the polarization degree $\Delta f$ of which the ratio of the polarization achieved by 180° rotation is highest is obtained. According to this method, the polarization degree achieved by 90° rotation is included in the residual polarization degree, but the ratio of the polarization degree achieved by 180° rotation is highest. Accordingly, a piezoelectric material which is stable thermally with passage of time can be obtained. Moreover, a piezoelectric material of which the polarization degree $\Delta f$ is coincident with a target value can be obtained.

According to the fourth aspect of the present invention, similarly to the method according to the third aspect of the present invention, a determination is made as to the temperature $T_A$ for obtaining the polarization degree $\Delta f$ in which the ratio of the polarization degree $A_{180}$ achieved by 180° rotation to the polarization degree $\Delta 90°$ achieved by 90° rotation has a predetermined value. In the case that total polarization is carried out with difficulty, to obtain the above-described polarization degree $\Delta f$, the total polarization is carried out at a temperature $T_P$ lower than the temperature $T_A$, at which the total polarization can be conducted relatively easily. Next, by aging at the temperature $T_A$, the polarization achieved by 90° rotation is partially restored so that the ratio of the polarization degree achieved by 180° rotation to that by 90° rotation has a predetermined value. By the above-described operations, similarly to the method according to the third aspect of the present invention, a piezoelectric material of which the ratio of the polarization degree achieved by 180° rotation to that achieved by 90° rotation has a predetermined value, and moreover, the overall polarization degree $\Delta f$ is correctly coincident with a target value can be obtained.

BRIEF DESCRIPTION OF THE DRAWINGS

FIGS. 1A, 1B, and 1C illustrate the change in directions of the spontaneous polarization of a piezoelectric material;

FIG. 2 is a graph showing the relation between the polarization temperatures and the polarization degrees achieved by 180° and 90° rotation;

DESCRIPTION OF THE PREFERRED EMBODIMENT

Figure 5:
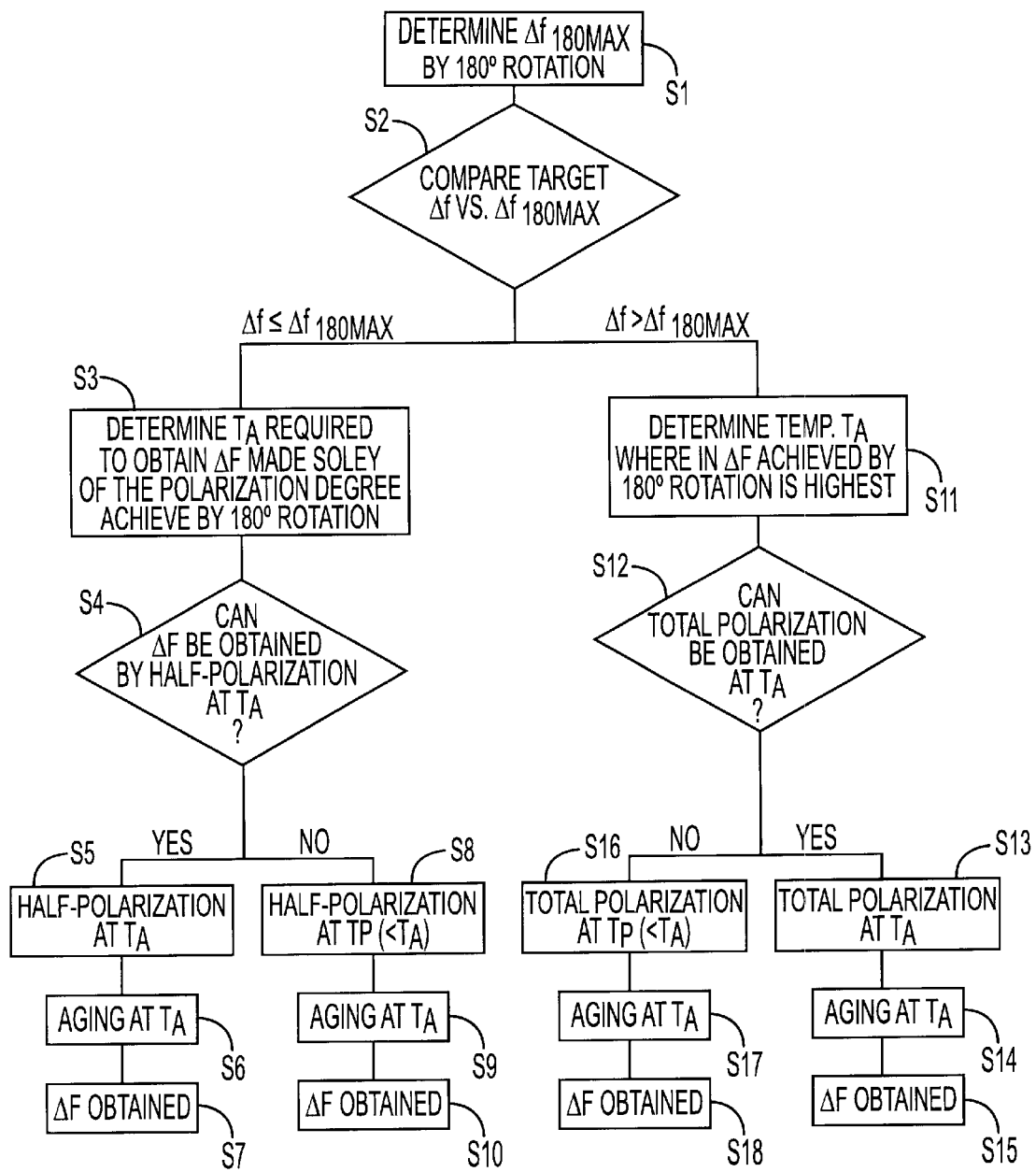
FIG. 5 is a flow diagram illustrating a polarization treatment methods according to the present invention.

An example of a method of polarization-treating a piezoelectric material according to the present invention will be described with reference to FIG. 5. FIG. 5 illustrates four treatment methods. S1 through S7 designate a first treatment method, S1 through S4 and S8 through S10 a second treatment method, S1, S2, S11 through S15 a third treatment method, and S1, S2, S11, S12, and S16 through S18 a fourth treatment method.

According to the first and second treatment methods, the residual polarization degree $\Delta f$ is made coincident with a target value, and all the polarization degree $\Delta f$ is made up solely of the polarization degree $\Delta f_{180}$ achieved by 180° rotation. On the other hand, according to the third and fourth treatment methods, in the case that the polarization degree $\Delta f$ cannot be made up solely of the polarization degree achieved by 180° rotation by any treatment method, the polarization degree $\Delta f$ is made coincident with a target value, and the ratio of the polarization degree achieved by 180° rotation in the polarization degree $\Delta f$ becomes highest.

Next, the first and second methods are described below.

First, the maximum polarization degree $\Delta f_{180max}$ achieved by 180° rotation is determined (step S1).

The maximum polarization degree $\Delta f_{180max}$ is determined by an employed piezoelectric material, irrespective of polarizing ways (half- or total-polarization) and temperature.

Next, a target value $\Delta f$ and the above-described maximum polarization degree $\Delta f_{180max}$ are compared (step S2). The target polarization degree $\Delta f$ is arbitrarily set, depending on the uses and types of products comprising the piezoelectric material. When $\Delta f \leq \Delta f_{180max}$ is shown as a result of the comparison, the treatment of steps S3 through S10 is executed. In the case of $\Delta f > \Delta f_{180max}$, the treatment of the steps S11 through S18 are carried out.

Figure 3:
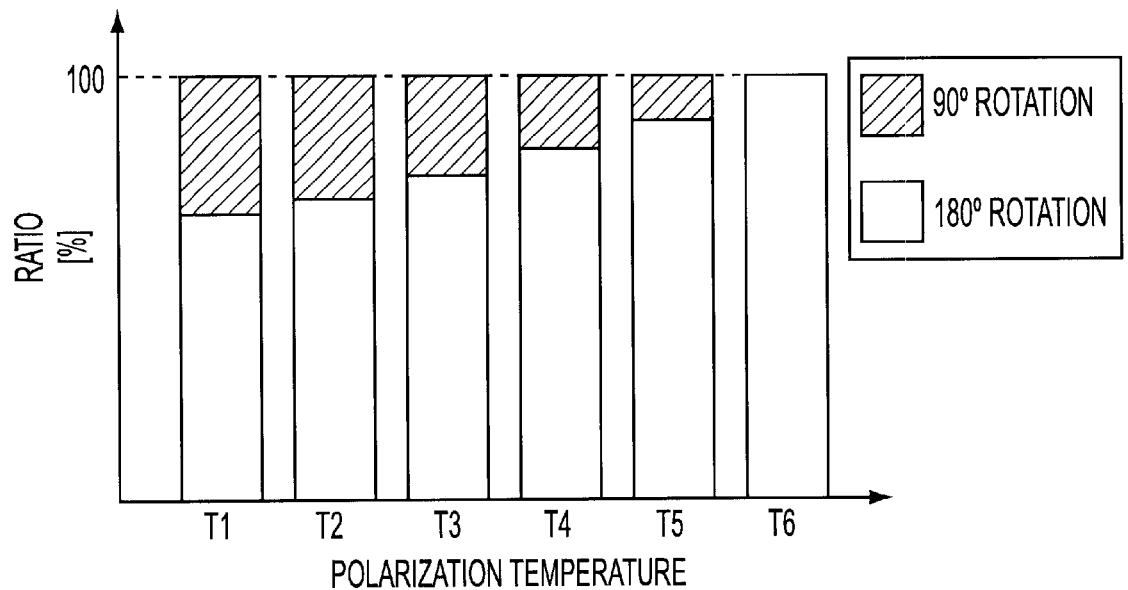
FIG. 3 is a graph showing the relation between the polarization temperatures and the ratios of the polarization degrees achieved by 180° and 90° rotation in the polarization degrees.
Figure 4:
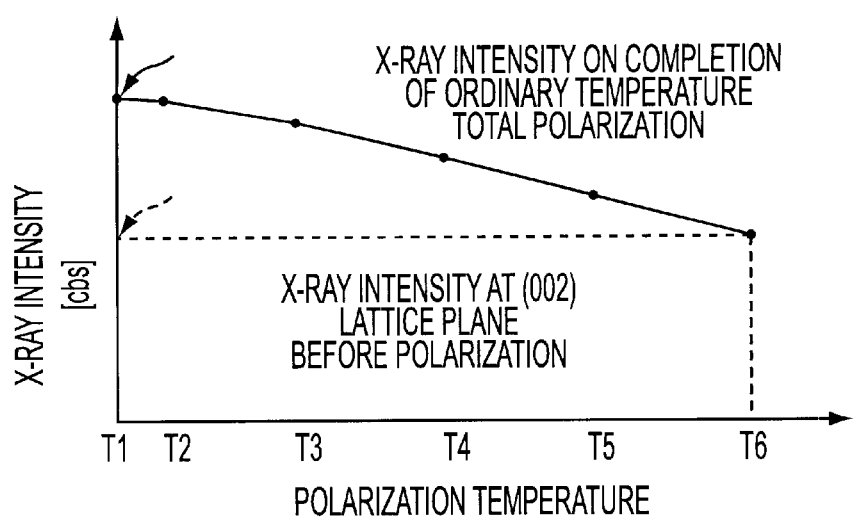
FIG. 4 is a graph showing the relation between the polarization temperatures and the X-ray intensities at the (002) crystal lattice plane.

The relation of $\Delta f \leq \Delta f_{180max}$ means that the target polarization degree $\Delta f$ can be made up solely of the polarization degree achieved by 180° rotation. Accordingly, a determination is made as to the temperature $T_A$ for obtaining $\Delta f$ made up solely of the polarization degree achieved by 180° rotation (step S3). For example, as seen in FIGS. 2 and 3, the temperature $T_A$ is equal to $T_6$.

Next, it is judged whether the target polarization degree $\Delta f$ can be achieved by half-polarization at the controlled temperature $T_A$ (step S4).

When control is possible at the high temperature $T_A$, the half-polarization is carried out under the control of voltage and time at the temperature $T_A$ to achieve $\Delta f$ (step S5). After this, aging is carried out at the same temperature $T_A$ (step S6) to obtain the target $\Delta f$ (step S7).

As described above, a piezoelectric material which has a target polarization degree $\Delta f$ and of which the ratio of the polarization achieved by 180° rotation is 100% can be obtained. Thus, the piezoelectric material is very stable thermally and with passage of time.

Figure 6:
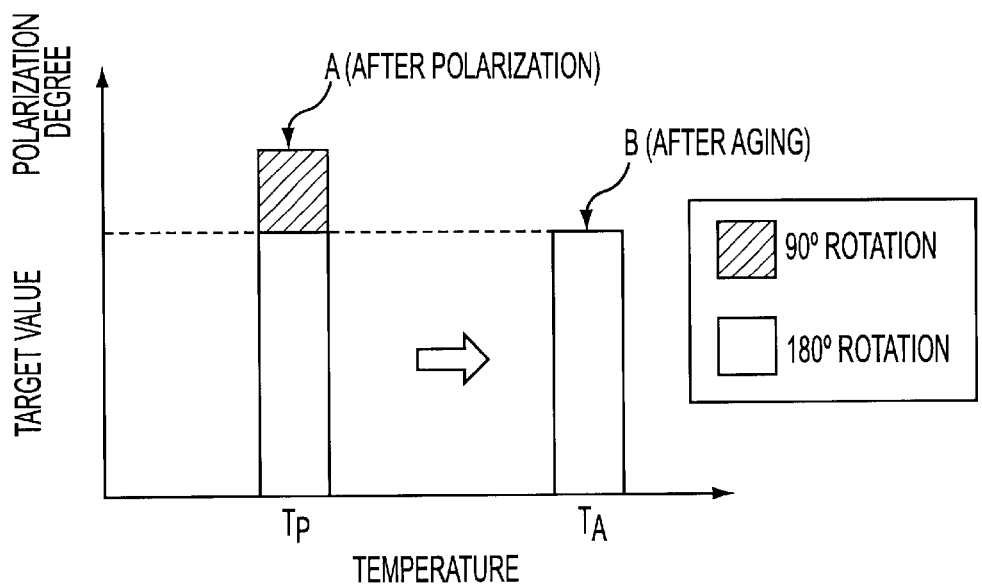
FIG. 6 is a graph showing the changes in the polarization degree after polarization and after aging.

When it is judged that the control to achieve $\Delta f$ at the temperature $T_A$ is difficult in step S4, the half-polarization is carried out under control at a temperature $T_P$ lower than the temperature $T_A$, whereby $\Delta f_P$ is determined by calculation (step S8). The reason lies in that the polarization control can be easily performed at a lower temperature. In reference to FIG. 2, $\Delta f_P$ is a polarization degree $\Delta f$ at a temperature between T1 and T5. $\Delta f_P$ is such that the polarization degree $\Delta f_{180}$ achieved by 180° rotation at the temperature $T_P$ is equal to the polarization degree $\Delta f_{180}$, which is the final target, achieved by 180° rotation at the temperature T6. The polarization state obtained after the half-polarization is carried out as described above is illustrated at reference character A in FIG. 6. In this state, the polarization degree $\Delta f_{90}$ achieved by 90° rotation lies in the polarization degree $\Delta f$ to some degree.

After the half-polarization at the temperature $T_P$ is carried out, aging is conducted at the temperature $T_A$ (step S9), whereby all the polarization achieved by 90° rotation in the polarization degree $\Delta f$ is restored to the original state, and thereby, the polarization degree $\Delta f$ is made up solely of the polarization degree achieved by 180° degree. This state is illustrated by reference character B in FIG. 6. The polarization degree $\Delta f_{180}$ achieved by 180° rotation is not changed by the aging at all.

As described above, a piezoelectric material having a target polarization degree $\Delta f$ is obtained, wherein $\Delta f$ is made up solely of the polarization degree achieved by 180° rotation (step S10).

Hereinafter, the third and fourth treatment methods will be described.

When $\Delta f > \Delta f_{180max}$ is judged by the comparison of the target value $\Delta f$ with the maximum polarization degree $\Delta f_{180max}$ in the step S2, it means that the target polarization degree $\Delta f$ can not be made up solely of the polarization degree achieved by 180° rotation by any treatment method. Accordingly, a determination is made as to the temperature $T_A$ at which the ratio of the polarization degree $\Delta f$ achieved by 180° rotation is highest (step S11). For example, the temperature $T_A$ is equal to $T_5$ in reference to FIG. 2.

Next, it is judged whether the total polarization is possible at the temperature $T_A$ or not (step S12). In particular, it is judged whether temperature control is possible under the total polarization condition, whether the temperature $T_A$ can be maintained from the standpoint of restrictions such as a jig for holding a piezoelectric material or not, and so forth.

When it is judged that the total polarization is possible at the temperature $T_A$, the total polarization is carried out at the temperature $T_A$ (step S13). In contrast to half-polarization, by the total polarization, a predetermined voltage is applied for a predetermined time to achieve a maximum polarization degree $\Delta f$. After this, aging is carried out at the temperature $T_A$ (step S14) to achieve the target polarization degree $\Delta f$ (step S15).

By the treatment as described above, a piezoelectric material of which the ratio of the polarization degree achieved by 180° rotation is highest and the overall polarization degree $\Delta f$ is coincident with the target value can be obtained.

When it is judged that the total polarization is impossible at the temperature $T_A$, the total polarization is carried out at a temperature $T_P$ lower than the temperature $T_A$ (step S16). Assuming that $T_A$ is equal to $T_5$ in reference to FIG. 2, $T_P$ is one of T1 through T4. In this case, the control of voltage and time is unnecessary. The polarization treatment is carried out so as to obtain the maximum polarization degree $\Delta f$. After this, aging is conducted at the temperature $T_A$ whereby a part of the polarization achieved by 90° rotation is restored to its original state (step S17). That is, the polarization degree is adjusted so as to have the same ratio as that of the polarization degree achieved by 180° rotation at the temperature $T_A$, whereby the target polarization degree $\Delta f$ is achieved (step S18). By the treatment as described above, a piezoelectric material of which the ratio of the polarization degree achieved by 180° rotation is as high as possible and the residual polarization degree $\Delta f$ is coincident with a target value can be obtained.

Figure 7A:
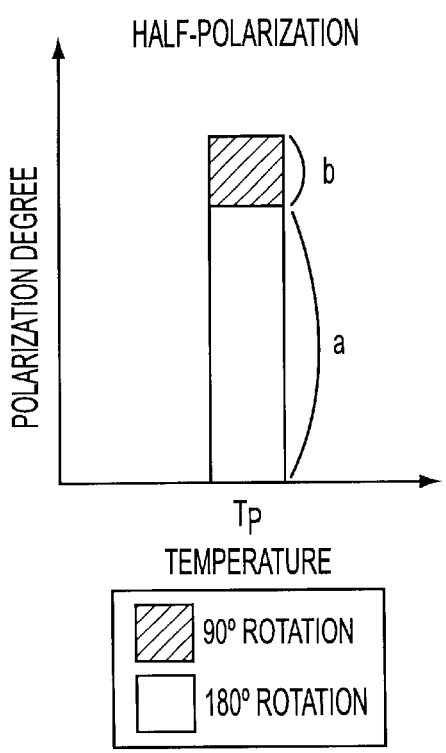
FIG. 7 is a graph showing the difference between the polarization degrees achieved by half-polarization and total polarization.
Figure 7B:
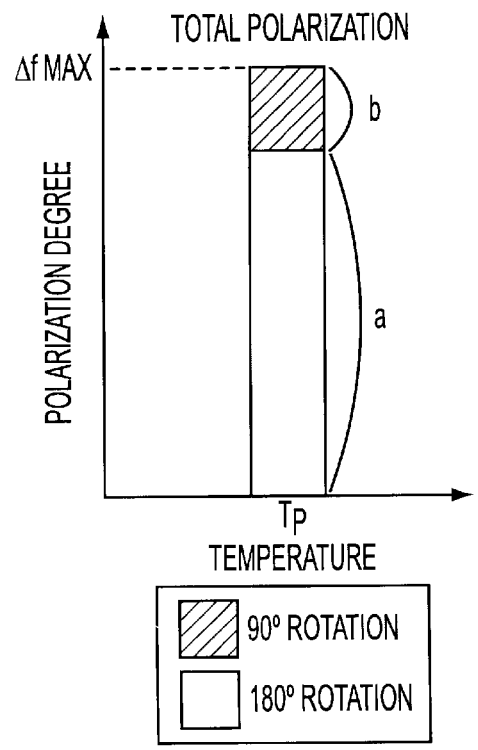

FIG. 7 shows the difference between the polarization degrees achieved by half-polarization and total polarization.

As shown in FIG. 7, the polarization degree $\Delta f$ achieved by the total polarization is higher than that by the half-polarization, though the polarization temperatures $T_P$ are the same. The polarization degree $\Delta f$ has the maximum value $\Delta f_{max}$. On the other hand, the ratio (a:b) of the polarization degree achieved by 180° rotation to that by 90° rotation has no difference between the half-polarization and the total polarization.

As understood clearly in the above-description, according to the first aspect of the present invention, the half-polarization is carried out at the temperature $T_A$ for obtaining the polarization degree made up solely of 180° rotation, and aging is conducted at the same temperature. Accordingly, a piezoelectric material of which the ratio of the polarization degree achieved by 180° rotation is 100%, which is stable thermally and has a polarization degree correctly coincident with a target value can be obtained.

According to the second aspect of the present invention, similarly to the method according to the first aspect of the present invention, the temperature $T_A$ for obtaining the polarization degree made up solely of the polarization degree achieved by 180° rotation is determined. Half-polarization is carried out at a temperature $T_P$ lower than the temperature $T_A$, and thereafter, aging is conducted at the temperature $T_A$ at which all the polarization achieved by 90° rotation is restored to the original state. Accordingly, a piezoelectric material can be wherein the ratio of the polarization degree achieved by 180° rotation is 100%, which is stable thermally with passage of time, and has a polarization degree correctly coincident with a target value. In addition, as compared with the method according to the first aspect of the present invention, the half-polarization is carried out at a lower temperature. This enhances the applicability of this treatment method.

According to the third aspect of the present invention, in the case that the polarization degree made up solely of the polarization degree achieved by 180° rotation can not be obtained, a determination is made as to the temperature $T_A$ for obtaining the polarization degree at which the ratio of the polarization degree achieved by 180° rotation is highest. Total polarization is carried out at the temperature $T_A$, and then, aging is conducted at the same temperature $T_A$. Accordingly, a piezoelectric material wherein the ratio of the polarization degree achieved by 180° rotation is highest, which is stable thermally and with passage of time, and wherein the polarization degree is correctly coincident with a target value can be obtained.

Moreover, according to the fourth aspect of the present invention, similarly to the method according to the third aspect of the present invention, in the case that the polarization degree made up solely of the polarization degree achieved by 180° rotation can not be obtained by any way, a piezoelectric material wherein the ratio of the polarization degree achieved by 180° rotation is highest, which is stable thermally, with passage of time, and has a polarization degree correctly coincident with a target value can be obtained. In addition, as compared with the method according to the third aspect of the present invention, the total polarization is carried out at a lower temperature. Accordingly, this treatment method has a high applicability.

What is claimed is:

1. A method of polarization-treating a piezoelectric ceramic material comprising the steps of
obtaining the maximum polarization degree $\Delta f_{180max}$ achieved by 180° rotation,
comparing a target residual polarization degree $\Delta f$ with said maximum polarization degree $\Delta f_{180max}$,
determining the temperature $T_A$ for obtaining the polarization degree $\Delta f$ made up solely of the polarization degree achieved by 180° rotation when $\Delta f \leq \Delta f_{180max}$, carrying out half-polarization under control of a voltage and at a temperature less than or equal to $T_A$, and carrying out aging at the temperature $T_A$.

2. The method of polarization-treating a piezoelectric ceramic material according to claim 1, wherein the step of carrying out half-polarization is performed at the temperature $T_A$.

3. The method of polarization-treating a piezoelectric ceramic material according to claim 1, wherein the step of carrying out half-polarization is performed at a temperature $T_P$ less than the temperature $T_A$.

4. The method of polarization-treating a piezoelectric ceramic material according to claim 1, wherein the piezoelectric ceramic material is a PZT ceramic.

5. A method of polarization-treating a piezoelectric ceramic material which comprises the steps of obtaining the maximum polarization degree $\Delta f_{180max}$ achieved by 180° rotation, comparing a target residual polarization degree $\Delta f$ with said maximum polarization degree $\Delta f_{180max}$, determining the temperature $T_A$ for obtaining the polarization degree $\Delta f$ in which the ratio of the polarization degree achieved by 180° rotation is highest when $\Delta f > \Delta f_{180max}$, carrying out total-polarization under control of a voltage and at a temperature less than or equal to $T_A$, and carrying out aging it at the temperature $T_A$.

6. The method of polarization-treating a piezoelectric ceramic material according to claim 5 wherein the step of carrying out total-polarization is performed at the temperature $T_A$.

7. The method of polarization-treating a piezoelectric ceramic material according to claim 5, wherein the step of carrying out total-polarization is performed at a temperature $T_P$ less than the temperature $T_A$.

8. The method of polarization-treating a piezoelectric ceramic material according to claim 5, wherein the piezoelectric ceramic material is a PZT ceramic.

* * * * *